US011739215B2

United States Patent
Sakurai

(10) Patent No.: US 11,739,215 B2
(45) Date of Patent: Aug. 29, 2023

(54) PHOTOSENSITIVE RESIN COMPOSITION

(71) Applicant: ZEON CORPORATION, Tokyo (JP)

(72) Inventor: Takaaki Sakurai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 950 days.

(21) Appl. No.: 16/483,848

(22) PCT Filed: Feb. 7, 2018

(86) PCT No.: PCT/JP2018/004246
§ 371 (c)(1),
(2) Date: Aug. 6, 2019

(87) PCT Pub. No.: WO2018/155188
PCT Pub. Date: Aug. 30, 2018

(65) Prior Publication Data
US 2020/0012192 A1  Jan. 9, 2020

(30) Foreign Application Priority Data

Feb. 21, 2017 (JP) .................................. 2017-030138

(51) Int. Cl.
*C08L 79/08* (2006.01)
*C08F 12/14* (2006.01)
(Continued)

(52) U.S. Cl.
CPC .............. *C08L 79/08* (2013.01); *C08F 12/14* (2013.01); *C08F 12/24* (2013.01); *C08F 20/14* (2013.01);
(Continued)

(58) Field of Classification Search
CPC .. C08G 73/10; C08G 73/1007; C08G 73/101; C08G 73/1042; C08G 73/14;
(Continued)

(56) References Cited

U.S. PATENT DOCUMENTS 6,238,840 B1 * 5/2001 Hirayama ............... G03F 7/038
522/100
2004/0191672 A1    9/2004 Oguro et al.
(Continued)

FOREIGN PATENT DOCUMENTS

JP    2002220417 A    8/2002
JP    2014029766 A    2/2014
(Continued)

OTHER PUBLICATIONS

May 1, 2018, International Search Report issued in the International Patent Application No. PCT/JP2018/004246.
(Continued)

*Primary Examiner* — Ling Siu Choi
*Assistant Examiner* — David L Miller
(74) *Attorney, Agent, or Firm* — Kenja IP Law PC

(57) ABSTRACT

Disclosed are photosensitive resin compositions capable of forming positive resin films with excellent heat shape retention. The photosensitive resin compositions comprises a polymer having a monomer unit represented by the following general formula (I) and a polyamideimide:

(I)

(Continued)

where $R^1$ is a single chemical bond or a divalent C1-C6 hydrocarbon group which may have a substituent, and $R^2$ is a hydrogen or a monovalent C1-C6 hydrocarbon group which may have a substituent.

7 Claims, 1 Drawing Sheet

(51) Int. Cl.

| | | |
|---|---|---|
| *C08F 20/14* | (2006.01) | |
| *G03F 7/039* | (2006.01) | |
| *C08F 12/24* | (2006.01) | |
| *C08F 212/14* | (2006.01) | |
| *C08F 12/22* | (2006.01) | |
| *G03F 7/037* | (2006.01) | |
| *C08F 112/14* | (2006.01) | |

(52) U.S. Cl.
CPC ............ *C08F 212/24* (2020.02); *G03F 7/039* (2013.01); *C08F 12/22* (2013.01); *C08F 112/14* (2013.01); *C08F 112/22* (2020.02); *C08F 112/24* (2020.02); *C08F 212/14* (2013.01); *C08F 212/22* (2020.02); *G03F 7/037* (2013.01); *G03F 7/0392* (2013.01); *G03F 7/0395* (2013.01); *G03F 7/0397* (2013.01)

(58) Field of Classification Search
CPC .......... C08G 79/08; C08F 12/14; C08F 12/22; C08F 12/24; C08F 112/14; C08F 112/22; C08F 112/24; C08F 212/14; C08F 212/22; C08F 212/24; G03F 39/0392; G03F 39/0395; G03F 39/0397; G03F 39/037
See application file for complete search history.

(56) References Cited

U.S. PATENT DOCUMENTS

| | | | | |
|---|---|---|---|---|
| 2007/0004816 | A1* | 1/2007 | Yashiro | ................ G03F 7/0037 522/69 |
| 2007/0015872 | A1* | 1/2007 | Arima | ................... C08L 101/02 525/92 F |
| 2014/0141376 | A1* | 5/2014 | Cho | ...................... G03F 7/2004 430/287.1 |
| 2017/0327644 | A1* | 11/2017 | Masuda | ................... G03F 7/075 |
| 2018/0164683 | A1* | 6/2018 | Fujiwara | ............. H01L 21/3081 |

FOREIGN PATENT DOCUMENTS

| | | | |
|---|---|---|---|
| KR | 1020040066720 A | 7/2004 | |
| WO | WO-2016084694 A1 * | 6/2016 | ............ C08G 69/42 |
| WO | 2016171179 A1 | 10/2016 | |
| WO | WO-2016171179 A1 * | 10/2016 | ............. C08F 12/24 |

OTHER PUBLICATIONS

Aug. 27, 2019, International Preliminary Report on Patentability issued in the International Patent Application No. PCT/JP2018/004246.

* cited by examiner

PHOTOSENSITIVE RESIN COMPOSITION

TECHNICAL FIELD

The present disclosure relates to photosensitive resin compositions and, in particular, photosensitive resin compositions capable of forming positive resist films with excellent heat shape retention.

BACKGROUND

Organic electroluminescent elements (organic EL electroluminescent elements), an example of electronic components, are provided with a variety of resin films, such as protective films for preventing degradation and damage, planarizing films for planarizing the element surface and interconnections, electric insulating films for ensuring electrical insulation, and pixel separation films for separating light emitter portions.

Similarly, micro light-emitting diodes (LEDs) and organic light-emitting diode (OLEDs), other examples of electronic components, are provided with a variety of resin films, such as protective films for preventing degradation and damage, electric insulating films for ensuring electrical insulation, and passivation films for preventing the inside from the external moisture and metal ions.

Thermosetting resin materials such as epoxy resins have heretofore been widely used as resin materials for forming such resin films. However, with recent increases in the density of interconnections and devices, resin materials with excellent transparency have been required also for these resin materials.

For micro LEDs and micro OLEDs, inorganic materials such as silicon dioxide, aluminum oxide and silicon nitride have been widely used as materials for forming such resin films. However, with recent increases in luminance, resin materials with better transparency have been required also for resin materials for micro LEDs and micro OLEDs.

To meet such demands, photosensitive resin compositions containing various resin materials have been proposed. For example, PTL 1 discloses using photosensitive resin compositions which comprise i) a polymer having a monomer unit made up of a specific phenol compound, ii) a radiation-sensitive compound, and iii) a cross-linker for forming positive resin films with improved sensitivity as well as excellent transparency.

CITATION LIST

Patent Literature

PTL 1: JP2014-29766A

SUMMARY

Technical Problem

When patterned, resin films used to constitute organic electroluminescent elements (organic EL elements), micro LEDs and micro OLEDs are required to retain the patterned shape without being melted or deformed (i.e., have heat shape retention) during or after a heating step.

However, positive resists formed using the photosensitive resin compositions disclosed in PTL 1 have room for improvement in heat shape retention.

Solution to Problem

The inventor made extensive studies to achieve the foregoing object. The inventor established that the use of a photosensitive resin composition which comprises a polymer having a vinylphenol monomer unit and a polyamideimide makes it possible to form a positive resist film with excellent heat shape retention, and completed the present disclosure.

Specifically, the present disclosure aims to advantageously solve the foregoing problem, and photosensitive resin compositions of the present disclosure comprise a polymer having a vinylphenol monomer unit and a polyamideimide.

With a polyamideimide being included in the photosensitive resin compositions in addition to a polymer having a monomer unit represented by the following general formula (I), it is possible to form a positive resin film with excellent heat shape retention.

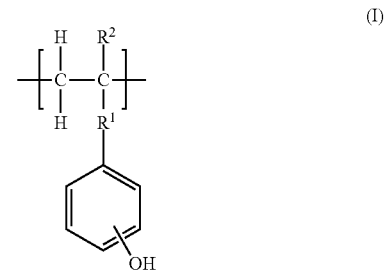

(I)

where R¹ is a single chemical bond or a divalent C1-C6 hydrocarbon group which may have a substituent, and R² is a hydrogen or a monovalent C1-C6 hydrocarbon group which may have a substituent.

In the photosensitive resin compositions, it is preferred that the polyamideimide is a polyamideimide having a branched structure. When the polyamideimide is such a polyamideimide having a branched structure, it is possible to improve the compatibility of the polyamideimide with the polymer having a vinylphenol monomer unit.

In the photosensitive resin compositions, it is preferred that the polyamideimide has a number-average molecular weight of 1,000 or more and 30,000 or less. When the number-average molecular weight of the polyamideimide is 1,000 or more, it is possible to improve the formation as well as the heat shape retention of the resulting resin film (coating film). When the number-average molecular weight of the polyamideimide is 30,000 or less, it is possible to improve the compatibility of the polyamideimide with the polymer having a vinylphenol monomer unit.

In the photosensitive resin compositions, it is preferred that the polymer is a copolymer further having a (meth)acrylate monomer unit. When the polymer is a copolymer further having a (meth)acrylate monomer unit, it is possible to improve the sensitivity of the photosensitive resin composition, as well as to form a resist film with excellent transparency.

The term "(meth)acrylate" as used herein means "acrylate and/or methacrylate."

In the photosensitive resin compositions, it is preferred that the content ratio by mass of the polymer to the polyamideimide (polymer:polyamideimide) is 90:10 to 70:30. When the content ratio by mass of the polymer to the polyamideimide is 90:10 to 70:30, it is possible to limit reduction in the transparency of the resulting resist film, prevent reduction in the film retention rate after development, improve heat shape retention, and prevent reduction in sensitivity.

In the photosensitive resin compositions, it is preferred that a photoactive compound and a cross-linker are further included. When the photosensitive resin composition further comprises a photoactive compound and a cross-linker, it is possible to easily form a positive resist film.

Advantageous Effect

According to the photosensitive resin compositions of the present disclosure, it is possible to form a positive resist film with excellent heat shape retention.

DETAILED DESCRIPTION

Figure 1:
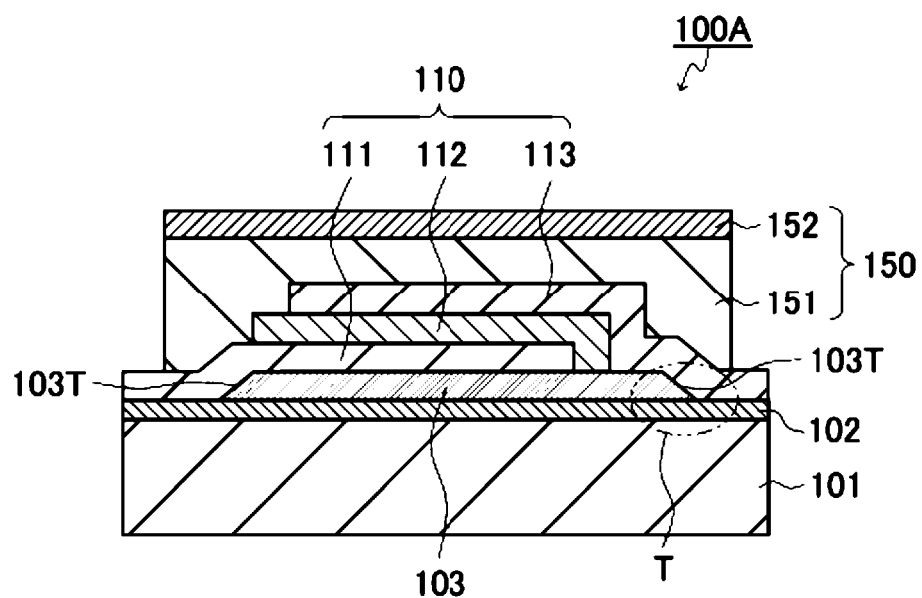
FIG. 1 is a schematic cross-sectional view showing an embodiment of an organic electroluminescent device having an organic electroluminescent element (organic EL element) formed on an organic insulating layer patterned using a photosensitive resin composition of the present disclosure.

Embodiments of the present disclosure will now be described in detail.

Photosensitive resin compositions of the present disclosure can be used for example when forming a resist pattern in the process of manufacturing a printed circuit board such as a build-up board for organic EL.

Further, the photosensitive resin compositions can be used for example for protective films, electrical insulating films and passivation films for organic electroluminescent elements (organic EL elements), micro LEDs, micro OLEDs and touch panels.

(Photosensitive Resin Composition)

Photosensitive resin compositions of the present disclosure comprise a predetermined polymer and a polyamideimide, and optionally further comprise a photoactive compound, a cross-linker, a solvent, and known additives which may be added in the photosensitive resin compositions. Because the photosensitive resin compositions comprise a polyamideimide in addition to the predetermined polymer, it is possible to form a positive resist film with excellent heat shape retention.

<Polymer>

The polymer used for the photosensitive resin compositions of the present disclosure has a predetermined monomer unit.

[Monomer Unit]

The monomer unit has a monomer unit represented by the following general formula (I), preferably a vinylphenol monomer unit, and optionally further has a (meth)acrylate monomer unit, an aromatic vinyl monomer unit (excluding the vinylphenol monomer unit), and/or other additional monomer unit(s).

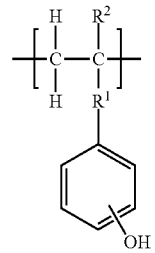

(I)

where $R^1$ is a single chemical bond or a divalent C1-C6 hydrocarbon group which may have a substituent, and $R^2$ is a hydrogen or a monovalent C1-C6 hydrocarbon group which may have a substituent.

—Monomer Unit Represented by General Formula (I)—

The monomer unit represented by the general formula (I) is a structural unit represented by the following general formula (I):

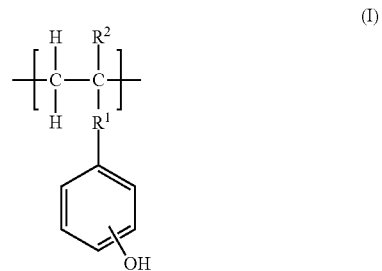

(I)

In the general formula (I), $R^1$ is a single chemical bond or a divalent C1-C6 hydrocarbon group which may have a substituent, preferably a single chemical bond or a C1-C4 alkylene group (branched or linear), and more preferably a single chemical bond or a C1-C2 alkylene group. In the general formula (I), $R^2$ is a hydrogen or a monovalent C1-C6 hydrocarbon group which may have a substituent, preferably a hydrogen or a C1-C4 alkyl group, and more preferably a hydrogen or a C1-C2 alkyl group.

Examples of the substituent include halogens such as fluorine, chlorine, and bromine; a C1-C10 alkoxy group such as methoxy group, ethoxy group and isopropoxy group; nitro group; cyano group; phenyl group which may have a substituent such as phenyl group, 4-methylphenyl group or 2-chlorophenyl group; and hydroxyl group.

Examples of the monomer unit represented by the general formula (I) include (i) a vinylphenol monomer unit described later; and (ii) monomer units derived from such monomers as α-methyl-4-hydroxystyrene, α-methyl-3-hydroxystyrene, α-methyl-2-hydroxystyrene, 4-hydroxyallylbenzene, 3-hydroxyallylbenzene, and 2-hydroxyallylbenzene. Preferred is the vinylphenol monomer unit described later.

—Vinylphenol Monomer Unit—

The vinyl phenol monomer unit is a structural unit represented by the following structural formula (I):

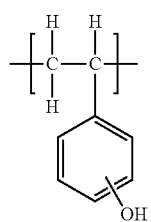

(I)

The structural unit represented by the structural formula (I) encompasses not only a structural unit derived from a vinylphenol monomer, but also structural units obtained by deprotecting structural units derived from compounds whose phenolic hydroxyl group is protected by any protection group (e.g., p-tert butoxystyrene), as demonstrated for example in Synthesis Example 1 described later.

Specific examples of vinylphenol monomers include 4-hydroxystyrene(p-vinylphenol), 3-hydroxystyrene(m-vinylphenol), and p-isopropenylphenol. Preferred is 4-hydroxystyrene(p-vinylphenol) for its easy availability and cost.

These vinylphenol monomers and compounds whose phenolic hydroxyl group is protected by any protection group may be used singly or in combination.

The amount of the structural unit represented by the structural formula (I) in the polymer is not particularly limited. It is preferably 30% by mass or more, and more preferably 50% by mass or more, but preferably 80% by mass or less, and more preferably 60% by mass or less.

When the amount of the structural unit represented by the structural formula (I) in the polymer is 30% by mass or more, dissolution in an alkaline developer can be achieved. On the other hand, when the amount of the vinylphenol monomer unit in the polymer is 80% by mass or less, it is possible for the resulting resist film to have better transparency.

—(Meth)Acrylate Monomer Unit—

The (meth)acrylate monomer unit is a structural unit derived from a (meth) acrylate monomer. It is preferred that the polymer is a copolymer which further has a (meth) acrylate monomer unit. When the polymer is a copolymer which further has a (meth)acrylate monomer unit, it is possible to increase the sensitivity of the photosensitive resin composition, as well as to form a resist film with excellent transparency.

Examples of (meth)acrylate monomers include, but not particularly limited to, (meth)acrylic acid alkyl esters such as methyl acrylate, ethyl acrylate, n-propyl acrylate, n-butyl acrylate, sec-butyl acrylate, n-heptyl acrylate, n-hexyl acrylate, n-octyl acrylate, 2-ethylhexyl acrylate, methyl methacrylate, ethyl methacrylate, n-propyl methacrylate, n-butyl methacrylate, n-octyl methacrylate, and n-decyl methacrylate; and (meth)acrylic acid alkoxyalkyl esters such as 2-methoxyethyl acrylate, 3-methoxypropyl acrylate, 3-methoxybutyl acrylate, ethoxymethyl acrylate, 2-methoxyethyl methacrylate, 3-methoxypropyl methacrylate, 3-methoxybutyl methacrylate, and ethoxymethyl methacrylate. Preferred are (meth)acrylic acid alkyl esters for their easy availability, cost and transparency, with methyl methacrylate being more preferred.

These (meth)acrylate monomers may be used singly or in combination.

The amount of the (meth)acrylate monomer unit in the copolymer is not particularly limited. It is preferably 20% by mass or more, and more preferably 40% by mass or more, but preferably 70% by mass or less, and more preferably 50% by mass or less.

When the amount of the (meth)acrylate monomer unit in the copolymer is 20% by mass or more, it is possible for the resulting resist film to have better transparency. On the other hand, when the amount of the (meth)acrylate monomer unit in the copolymer is 70% by mass or less, dissolution in an alkaline developer can be achieved.

—Aromatic Vinyl Monomer Unit (Excluding Vinylphenol Monomer Unit)—

The aromatic vinyl monomer unit is a structural unit derived from an aromatic vinyl monomer.

Examples of aromatic vinyl monomers include, but not particularly limited to, styrene, o-, m-, p-methylstyrene, p-tert-butylstyrene, ethylstyrene, 2,4-dimethylstyrene, and a-methylstyrene. Preferred is styrene for its easy availability and cost.

These aromatic vinyl monomers may be used singly or in combination.

The amount of the aromatic vinyl monomer unit in the copolymer is not particularly limited. It is preferably 30% by mass or more, and more preferably 40% by mass or more, but preferably 80% by mass or less, and more preferably 60% by mass or less.

When the amount of the aromatic vinyl monomer unit in the copolymer is 30% by mass or more, dissolution in an alkaline developer can be achieved. On the other hand, when the amount of the aromatic vinyl monomer unit in the copolymer is 80% by mass or less, it is possible for the resulting resist film to have better transparency.

—Additional Monomer Units—

The additional monomer unit(s) are structural unit(s) derived from monomer(s) copolymerizable with the monomers mentioned above. Examples of additional monomers include N-phenylmaleimide and acrylonitrile.

The additional monomers are not particularly limited so long as the effect of the present disclosure is not compromised.

Specific examples of the polymer include a vinylphenol/methyl methacrylate copolymer, a vinylphenol/styrene copolymer, and a vinylphenol homopolymer. Preferred is a vinylphenol/methyl methacrylate copolymer.

These polymers may be used singly or in combination.

[Properties of Polymer]

—Weight-Average Molecular Weight—

When the polymer is a vinylphenol/methyl methacrylate copolymer, the weight-average molecular weight (Mw) is preferably 12,000 or less, and more preferably 9,900 or less, but preferably 8,000 or more, and more preferably 9,600 or more. When the weight-average molecular weight (Mw) of the vinylphenol/methyl methacrylate copolymer is 12,000 or less, the solubility can be improved. A weight-average molecular weight (Mw) of the vinylphenol/methyl methacrylate copolymer of 8,000 or more is preferred from the viewpoint of formation of a coating film, and curing degree and mechanical strength of a cured film.

When the polymer is a vinylphenol/styrene copolymer, the weight-average molecular weight (Mw) is preferably 5,000 or less, but preferably 3,000 or more, and more preferably 4,000 or more. When the weight-average molecular weight (Mw) of the vinylphenol/styrene copolymer is 5,000 or less, the solubility can be improved. A weight-average molecular weight (Mw) of the vinylphenol/styrene copolymer of 3,000 or more is preferred from the viewpoint of formation of a coating film, and curing degree and mechanical strength of a cured film.

When the polymer is a vinylphenol homopolymer, the weight-average molecular weight (Mw) is preferably 11,000 or less, and preferably 10,000 or less, but preferably 4,000 or more, and more preferably 9,000 or more. When the weight-average molecular weight (Mw) of the vinylphenol homopolymer is 11,000 or less, the solubility can be improved. A weight-average molecular weight (Mw) of the vinylphenol homopolymer of 4,000 or more is preferred from the viewpoint of formation of a coating film, and curing degree and mechanical strength of a cured film.

The values described above are polystyrene-equivalent values.

—Molecular Weight Distribution—

The molecular weight distribution (Mw/Mn) of the polymer is preferably 1.5 or more, but preferably 5.0 or less, and more preferably 3.0 or less. When the molecular weight distribution (Mw/Mn) of the polymer is 1.5 or more, it is possible to produce the polymer more easily.

<Polyamideimide>

With a polyamideimide included in the photosensitive resin compositions of the present disclosure, it is possible to improve the sensitivity as well as to form a resist film with excellent transparency.

The polyamideimide used in the photosensitive resin compositions of the present disclosure may be either a polyamideimide having a branched structure or a polyamideimide having a linear structure, with a polyamideimide having a branched structure being preferred. When the polyamideimide has a branched structure, it is possible to improve the solubility of the photosensitive resin compositions.

[Polyamideimide Having Branched Structure]

Examples of polyamideimides having a branched structure include a compound which has a structural unit represented by the following general formula (1) and a structural unit represented by the following general formula (2) and which has one or more of any of the terminal structures represented by the following structural formulas (1), (2) and (3); a compound represented by the following general formula (3); and polyamideimide resins having a branched structure (UNIDIC EMG-793, UNIDIC EMG-1015, both manufactured by DIC Corporation).

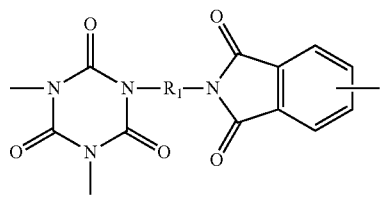

General formula (1)

where $R_1$ is an organic group having C6-C13 cycloaliphatic structure.

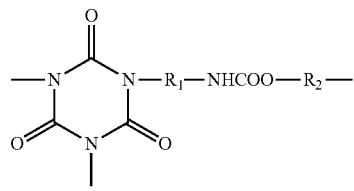

General formula (2)

where $R_1$ is an organic group having C6-C13 cycloaliphatic structure, and $R_2$ is a linear hydrocarbon structure having a number-average molecular weight of 700 to 4,500.

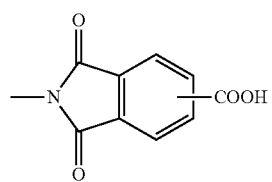

Structural formula (1)

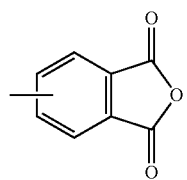

Structural formula (2)

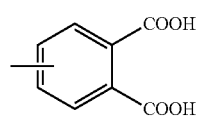

Structural formula (3)

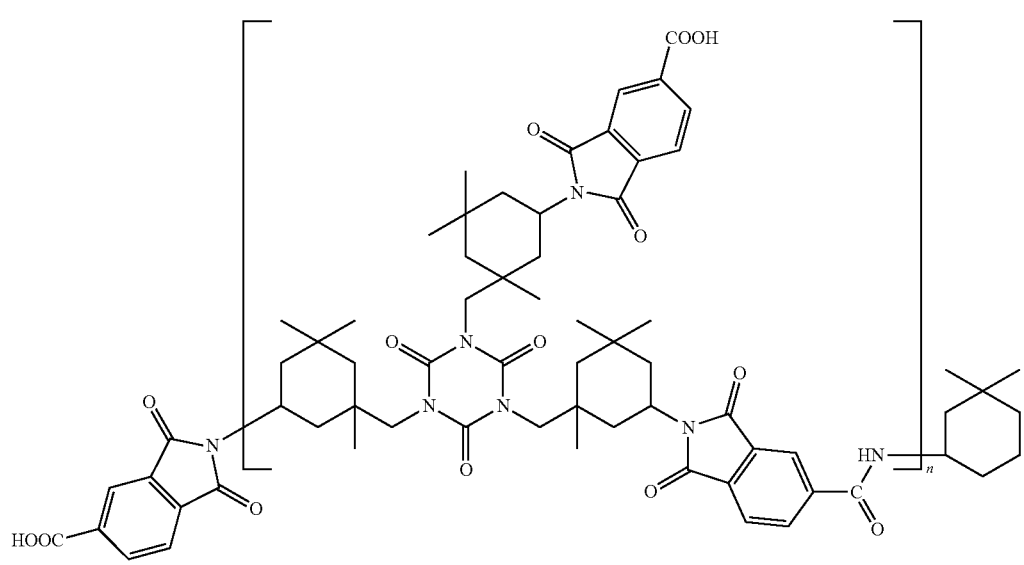
General formula (3)
where n is 2 or more and 200 or less.
The compound represented by the general formula (3) is obtained by reacting isophorone diisocyanate isocyanurate with trimellitic anhydride (see the following reaction scheme (1)).
Reaction scheme (1)
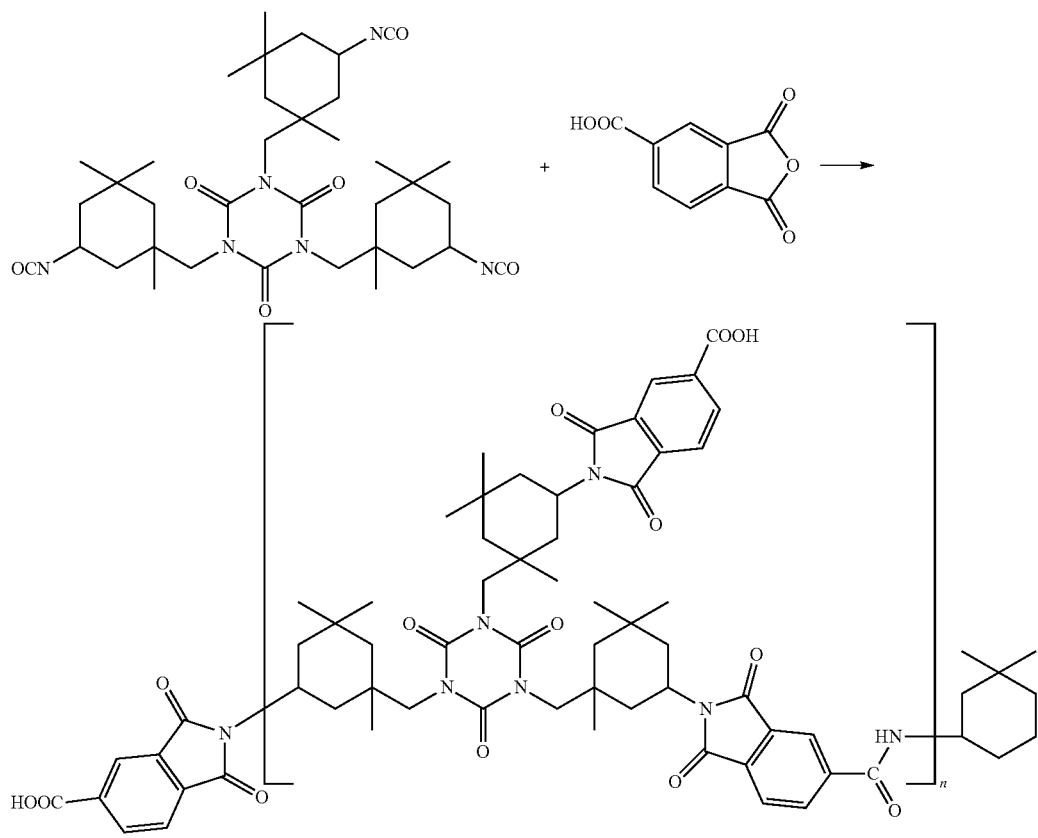
where n is 2 or more and 200 or less.

In the reaction shown in the reaction scheme (1), a polyfunctional polyol having two or more hydroxyl groups may be added as a chain transfer agent to introduce a site having urethane structure in a part of the compound represented by the general formula (3). Introduction of a site having urethane structure in a part of the compound represented by the general formula (3) makes it possible to control the physical properties of the polyamideimide having a branched structure. Examples of the site having urethane structure include a site represented by the following general formula (4).

General formula (4)

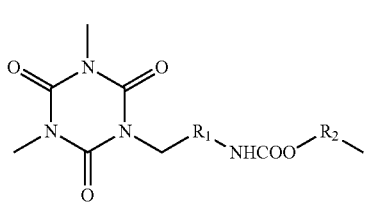

where $R_1$ is an organic group having C6-C13 cycloaliphatic structure, and $R_2$ is a linear hydrocarbon structure having a number-average molecular weight of 700 to 4,500.

[Polyamideimide Having Linear Structure]

Examples of polyamideimides having a linear structure include a compound represented by following general formula (3).

General formula (3)

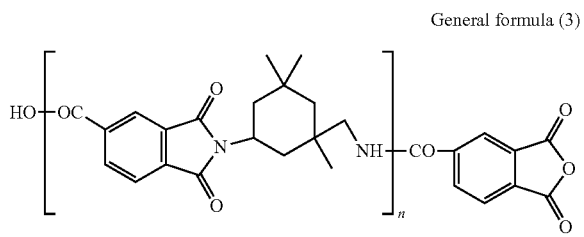

where n is 2 or more and 400 or less.

The compound represented by the general formula (3) is obtained by reacting trimellitic anhydride with isophorone diisocyanate (see the following reaction scheme (2)).

Reaction scheme (2)

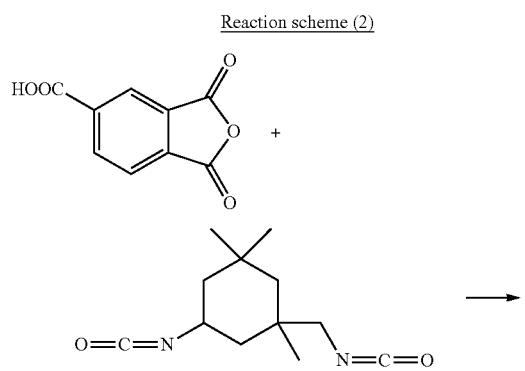

-continued

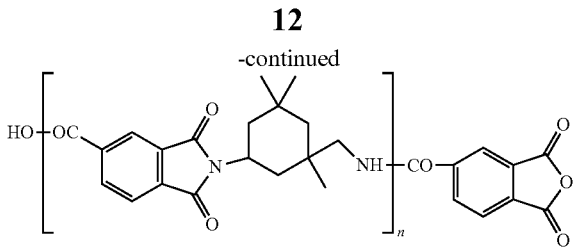

where n is 2 or more and 400 or less.

[Properties of Polyamideimide]
—Number-Average Molecular Weight—

The number-average molecular weight (Mn) of the polyamideimide is preferably 30,000 or less, and more preferably 8,000 or less, but preferably 1,000 or more. When the number-average molecular weight (Mn) of the polyamideimide is 30,000 or less, the solubility can be improved. When the number-average molecular weight (Mn) of the polyamideimide is 1,000 or more, heat resistance and mechanical strength of a cured film are excellent.

When the polyamideimide is a polyamideimide having a branched structure, the number-average molecular weight (Mn) is preferably 30,000 or less, but preferably 2,000 or more. When the number-average molecular weight (Mn) of the polyamideimide having a branched structure is 30,000 or less, the solubility can be improved. When the number-average molecular weight (Mn) of the polyamideimide having a branched structure is 2,000 or more, heat resistance and mechanical strength of a cured film are excellent.

When the polyamideimide is a polyamideimide having a branched structure, the weight-average molecular weight (Mw) is preferably 100,000 or less, but preferably 3,000 or more. When the weight-average molecular weight (Mw) of the polyamideimide having a branched structure is 100,000 or less, the solubility of the polyamideimide can be improved. When the weight-average molecular weight (Mw) of the polyamideimide having a branched structure is 3,000 or more, heat resistance and mechanical strength of a cured film are excellent.

When the polyamideimide is a polyamideimide having a linear structure, the number-average molecular weight (Mn) is preferably 20,000 or less, but preferably 1,000 or more. When the number-average molecular weight (Mn) of the polyamideimide having a linear structure is 20,000 or less, the solubility of the polyamideimide can be improved. When the number-average molecular weight (Mn) of the polyamideimide having a linear structure is 1,000 or more, heat resistance and mechanical strength of a cured film are excellent.

The proportion of the polymer in the total (100% by mass) of the polymer and the polyamideimide is preferably 70% by mass or more, and more preferably 80% by mass or more, but preferably 90% by mass or less, and more preferably 85% by mass or less. When the proportion of the polymer in the total (100% by mass) of the polymer and the polyamideimide is 70% by mass or more and 90% by mass or less, it is possible to prevent reduction in the transparency of the resulting resist film, film retention rate, shape retention, and sensitivity.

<Photoactive Compound>

Examples of photoactive compounds used in the photosensitive resin compositions of the present disclosure include an ester of 4,4'-[1-[4-[1-(4-hydroxyphenyl)-1-methylethyl]phenyl]ethylidene]bisphenol and 6-diazo-5,6-dihydro-5-oxo-naphthalene-1-sulfonic acid; an ester of 4,4'-[1-[4-[1-(4-hydroxyphenyl)-1-methylethyl]phenyl]

ethylidene]bisphenol (compound represented by the following structural formula (4)) and 6-diazo-5,6-dihydro-5-oxo-naphthalene-1-sulfonic acid; an ester of 1,1,1-tris(4-hydroxyphenyl)ethane (compound represented by the following structural formula (5)) and 6-diazo-5,6-dihydro-5-oxo-naphthalene-1-sulfonic acid; an ester of 2-(4-hydroxyphenyl)-2-(2',3',4'-trihydroxyphenyl)propane and 6-diazo-5,6-dihydro-5-oxo-naphthalene-1-sulfonic acid; and compounds known in the art as described in JP2014-29766A as "radiation-sensitive compound (B)." Preferred are an ester of 4,4'-[1-[4-[1-(4-hydroxyphenyl)-1-methylethyl]phenyl]ethylidene]bisphenol and 6-diazo-5,6-dihydro-5-oxo-naphthalene-1-sulfonic acid, and an ester of 1,1,1-tris(4-hydroxyphenyl)ethane and 6-diazo-5,6-dihydro-5-oxo-naphthalene-1-sulfonic acid.

These photoactive compounds may be used singly or in combination.

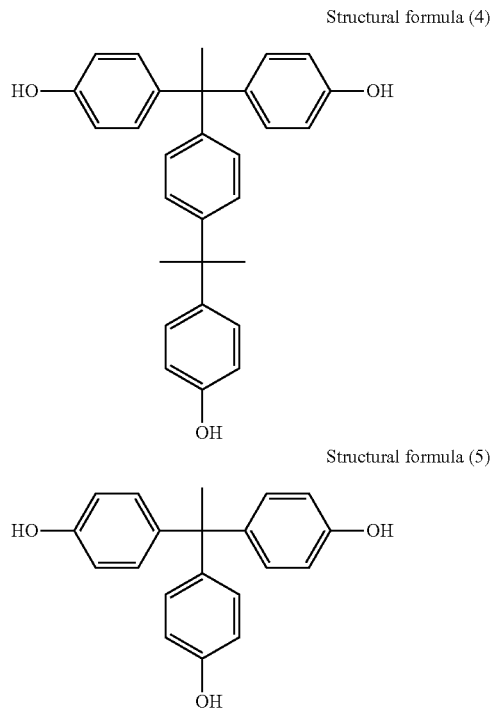

Structural formula (4)

Structural formula (5)

<Cross-Linker>

Examples of cross-linkers used in the photosensitive resin compositions of the present disclosure include multifunctional epoxy compounds such as tetra(3,4-epoxycyclohexylmethyl)butanetetracarboxylate modified ε-caprolactone (EPOLEAD GT401, manufactured by Daicel Chemical Industries, Ltd.); and compounds known in the art as described in JP2014-29766A as "cross-linker (C)." Preferred is tetra(3,4-epoxycyclohexylmethyl)butanetetracarboxylate modified ε-caprolactone from the perspective of flexibility and chemical resistance of a cured film.

These cross-linkers may be used singly or in combination.

[Solvent]

Solvents generally used in the photosensitive resin compositions of the present disclosure are ether solvents. Examples of ether solvents include diethylene glycol ethyl methyl ether (Hisolve EDM, manufactured by TOHO Chemical Industry Co., Ltd.), propylene glycol monomethyl ether (PGME), propylene glycol monomethyl ether acetate (PGMEA), γ-butyl lactone, 1-methyl-2-pyrrolidone, and mixtures thereof.

The solvent may be a mixed solvent as described above. It is preferred to use a single solvent made up of a single substance from the viewpoint of recovery and recycling of the solvent.

<Additives>

Examples of additives used in the photosensitive resin compositions of the present disclosure include dissolution promoters, antioxidants, surfactants, ultraviolet absorbers, pigments, and sensitizers. These additives may be used singly or in combination.

[Dissolution Promoter]

Examples of dissolution promoters include 5,5'-[2,2,2-trifluoro-1-(trifluoromethyl)ethylidene]bis[2-hydroxy-1,3-benzene dimethanol] (TML-BPAF-MF, manufactured by Honshu Chemical Industry Co., Ltd.), 3,3',5,5'-tetramethoxymethyl-4,4'-bisphenol (TMOM-BP, manufactured by Honshu Chemical Industry Co., Ltd.), melamine/formaldehyde/alkylmonoalcohol polycondensate (NIKALAC Mw-100LM, manufactured by Sanwa Chemical Co., Ltd.), and other dissolution promoters known in the art. Preferred is 5,5'-[2,2,2-trifluoro-1-(trifluoromethyl)ethylidene]bis[2-hydroxy-1,3-benzene dimethanol] from the viewpoint of chemical resistance and of mechanical strength of a cured film.

These dissolution promoters may be used singly or in combination.

[Antioxidant]

Examples of antioxidants include hindered phenols such as pentaerythritol-tetrakis[3-(3,5-di-tert-butyl-4-hydroxyphenyl)propionate] (compound represented by the following structural formula (6), Irganox 1010, manufactured by BASF), sulfur antioxidants such as 2,4-bis[(dodecylthio)methyl]-6-methylphenol (compound represented by the following structural formula (7), Irganox 1726, manufactured by BASF), and others antioxidants known in the art. Preferred is pentaerythritol-tetrakis [3-(3,5-di-tert-butyl-4-hydroxyphenyl)propionate] (Irganox 1010, manufactured by BASF) from the viewpoint of transparency.

These antioxidants may be used singly or in combination.

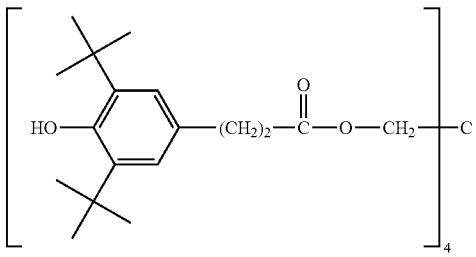

Structural formula (6)

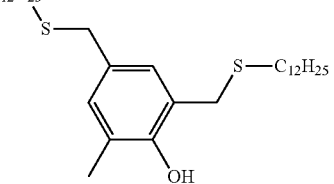

Structural formula (7)

[Surfactant]

Examples of surfactants include organosiloxane polymers (KP341, manufactured by Shin-Etsu Chemical Co., Ltd.)

and other surfactants known in the art. Preferred are organosiloxane polymers from the viewpoint of applicability on substrates.

These surfactants may be used singly or in combination.

<Method of Forming Resist Pattern>

A method of forming a resist pattern using the photosensitive resin composition of the present disclosure comprises: (1) forming a resist film using the photosensitive resin composition of the present disclosure (resist film forming step); (2) exposing the resist film (exposing step); and (3) developing the exposed resist film (developing step).

—Resist Film Forming Step—

In the step (1), the photosensitive resin composition is applied onto a workpiece (coating target) such as a substrate to be processed using a resist pattern, and the photosensitive resin composition applied is dried to form a resist film. Coating methods and drying methods are not particularly limited. Coating can be effected using any coating method known in the art (e.g., spin coating) and drying can be effected using any drying method known in the art.

—Exposing Step—

In the step (2), the resist film is irradiated with ionizing radiation or light to draw a desired pattern thereon. Irradiation with ionizing radiation or light can be effected using any drawing device known in the art, such as an electron beam drawing device or laser drawing device.

—Developing Step—

In the step (3), the resist film exposed in the exposure step is developed by contact with a developer to form a resist pattern on the workpiece.

The resist film can be brought in contact with a developer by any methods known in the art, e.g., by immersing the resist film into the developer or applying the developer onto the resist film.

—Developer—

Examples of usable developers include, but not particularly limited to, alkaline developers such as 2.38 mass % tetramethylammonium hydroxide aqueous solution.

—Development Condition—

The development condition can be set as appropriate such that a resist pattern of desired quality is obtained. The development time can be determined as appropriate by the method of determining the development condition described above.

<Organic Electroluminescent Device>

FIG. 1 is a schematic cross-sectional view showing an embodiment of an organic electroluminescent device having an organic electroluminescent element (organic EL element) formed on an organic insulating layer patterned using a photosensitive resin composition of the present disclosure.

In FIG. 1, an organic electroluminescent device (organic EL device) 100A includes on a surface of a conductive substrate 101 an inorganic insulating layer 102 and an organic insulating layer 103 which are laminated in the order presented, and includes an organic electroluminescent element (organic EL element) 110 provided on the organic insulating layer 103. The organic insulating layer 103 and the organic EL element 110 are surface-sealed using a sealing layer 151 and a sealing plate 152 which serve as a sealing material 150. The organic insulating layer 103 on which the organic EL element 110 is formed is disposed inside the sealing layer 151 so as not to be exposed from the sealing layer 151. The organic EL element 110 is configured to emit light by utilizing excitation energy generated by coupling of electrons and holes in the organic EL layer 12 by a current supplied from the outside through an anode 111 and a cathode 113. The light from the organic EL layer 112 emits from the cathode 113 side of the organic EL element 110 (top emission mode).

The organic insulating layer 103 is patterned by photolithography using the photosensitive resin composition such that it is formed in a selected region where the organic EL device 110 is to be formed. Photolithography offers high pattern accuracy and enables fine processing to be easily achieved. As will be described later, the sides of the organic insulating layer are formed as tapered surfaces inclining inward from the lower side to the upper side. Upon formation of tapered surfaces, the taper angle can be easily adjusted by adjusting the exposure dose of photolithography and the condition of post-baking.

Figure 2:
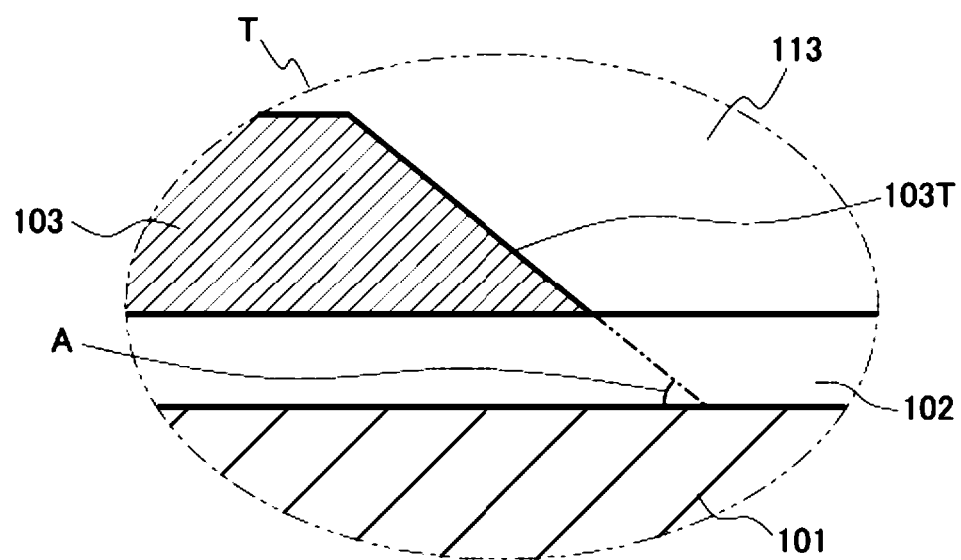
FIG. 2 is an enlarged explanatory view of a region T surrounded by a broken line in FIG. 1.

In FIG. 1, the organic insulating layer 103 of the organic EL device 100A has on its sides tapered surfaces 103T inclining inward from the lower side to the upper side. The tapered surface 103T preferably forms an angle of 1 degree or more and 50 degrees or less with a surface of the conductive substrate 101. FIG. 2 is an enlarged explanatory view of a region T surrounded by a broken line in FIG. 1. The angle mentioned above refers to an angle formed by intersection of the extension of a cross-sectional line of the side surface of the organic insulating layer 103 with the surface of the conductive substrate 101 (angle A in FIG. 2 (hereinafter also referred to as "taper angle")). If the taper angle exceeds 50 degrees, disconnection of the electrode (anode 111 or cathode 113) of the organic EL element 110 is likely to occur due to the step created by the organic insulating layer. If the taper angle is less than 1 degree, the width of the tapered surfaces increases, resulting in increased lengths of the lead-out electrodes and thus undesirably narrowing the area of the light emitter portion. The taper angle is preferably in the range of 10 degrees or more and 40 degrees or less, and more preferably in the range of 10 degrees or more and 20 degrees or less. When the side surfaces of the organic insulating layer 103 are formed as the tapered surfaces 103T having a taper angle that falls within the range of 1 degree or more and 50 degrees or less as described above, disconnection of the anode 111 and the cathode 113 of the organic EL element 110 can be prevented.

With the photosensitive resin compositions of the present disclosure, tapered surfaces having a taper angle that falls within the range described above can be easily formed.

EXAMPLES

The following provides a more specific description of the present disclosure based on Examples, which however shall not be construed as limiting the scope of the present disclosure. "Part(s)" in each example are by mass unless otherwise specified.

Synthesis Examples 1 to 4 below show preparation examples of polymers.

Synthesis Example 1

50 parts of p-tert-butoxystyrene, 50 parts of methyl methacrylate and 4 parts of azobisisobutyronitrile as a polymerization initiator are dissolved into 150 parts of propylene glycol monomethyl ether as a solvent. Polymerization was carried out under nitrogen atmosphere for 10 hours while maintaining the reaction temperature at 70° C. To the reaction solution was added sulfuric acid and reacted for 10 hours while maintaining the reaction temperature at 90° C., whereby the p-tert-butoxystyrene monomer unit is deproteted and converted into a p-vinylphenol monomer unit.

Ethyl acetate was added to the obtained copolymer, water washing was repeated 5 times, an ethyl acetate phase was separated, and the solvent was removed to afford a copolymer (A-1) having a p-vinylphenol monomer unit and a methyl methacrylate monomer unit. The ratios by mass of the monomer units in the copolymer (A-1) were found to be 50:50 (p-vinylphenol monomer unit:methyl methacrylate monomer unit). The weight-average molecular weight (Mw) was 9,600 in polystyrene equivalent.

Synthesis Example 2

A copolymer (A-2) having a p-vinylphenol monomer unit and a methyl methacrylate monomer unit was obtained in the same manner as in Synthesis Example 1 except that 60 parts of p-tert-butoxystyrene and 40 parts of methyl methacrylate were charged instead of charging 50 parts of p-tert-butoxystyrene and 50 parts of methyl methacrylate. The ratios by mass of the monomer units in the copolymer (A-2) were found to be 60:40 (p-vinylphenol monomer unit: methyl methacrylate monomer unit). The weight-average molecular weight (Mw) was 9,900 in polystyrene equivalent.

Synthesis Example 3

A copolymer (A-3) having a p-vinylphenol monomer unit and a styrene monomer unit was obtained in the same manner as in Synthesis Example 1 except that 50 parts of p-tert-butoxystyrene and 50 parts of styrene were used instead of using 50 parts of p-tert-butoxystyrene and 50 parts of methyl methacrylate. The ratios by mass of the monomer units in the copolymer (A-3) were found to be 50:50 (p-vinylphenol monomer unit:styrene monomer unit). The weight-average molecular weight (Mw) was 4,700 in polystyrene equivalent.

Synthesis Example 4

A p-vinylphenol homopolymer (A-4) was obtained in the same manner as in Synthesis Example 1 except that 100 parts of p-tert-butoxystyrene was used instead of using 50 parts of p-tert-butoxystyrene and 50 parts of methyl methacrylate. The weight-average molecular weight (Mw) of the p-vinylphenol homopolymer (A-4) was 9,400 in polystyrene equivalent.

Example 1

(i) As a polymer, 85 parts of the copolymer (A-1) having a p-vinylphenol monomer unit and a methyl methacrylate monomer unit obtained in Synthesis Example 1, (ii) as a polyamideimide, 15 parts of polyamideimide resin having a branched structure (UNIDIC EMG-793, manufactured by DIC Corporation, solid content=43.7% (solvent is propylene glycol monomethyl ether acetate), acid value=65.6 mg(KOH)/g, viscosity (25° C., E-type viscometer)=1.04 Pa·s, number-average molecular weight=2,000 or more and 30,000 or less), (iii) as a photoactive compound (radiation-sensitive compound), 12.5 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphthalene-1-sulfonic acid (TPA-525, manufactured by Miwon Commercial Co., Ltd.), and 12.5 parts of 1,1,1-tris (4-hydroxyphenyl)ethane esterified with 2 moles of 6-diazo-5,6-dihydro-5-oxo-naphthalene-1-sulfonic acid (HP-200, manufactured by Toyo Gosei Co., Ltd.), (iv) as a crosslinker, 33 parts of epoxylated butanetetracarboxylate tetrakis (3-cyclohexylmethyl) modified c-caprolactone (EPOLEAD GT401, Daicel Chemical Industries, Ltd.), (v) as a dissolution promoter, 8 parts of 5,5'-[2,2,2-trifluoro-1-(trifluoromethyl)ethylidene]bis[2-hydroxy-1,3-benzene dimethanol] (TML-BPAF-MF, manufactured by Honshu Chemical Industry Co., Ltd.), (vi) as an antioxidant, 2.5 parts of pentaerythritol-tetrakis[3-(3,5-di-tert-butyl-4-hydroxyphenyl)propionate] (Irganox 1010, manufactured by BASF) and 2.5 parts of 2,4-bis[(dodecylthio)methyl]-6-methylphenol (Irganox 1726, manufactured by BASF), (vii) as a surfactant, 300 ppm of an organosiloxane polymer (KP341, manufactured by Shin-Etsu Chemical Co., Ltd.), and (viii) as a solvent, 100 parts of diethylene glycol ethyl methyl ether (Hisolve EDM, manufactured by TOHO Chemical Industry Co., Ltd.) were mixed for dissolution, and the mixture was filtered through a polytetrafluoroethylene filter with a pore size of 0.45 μm to prepare a photosensitive resin composition. The photosensitive resin composition prepared was evaluated as will be described below for sensitivity, film retention rate after development, light transmittance, heat shape retention (%), chemical resistance, solubility, compatibility, and taper angle. The results are shown in Table 1.

<Sensitivity>

The photosensitive resin composition was applied on a silicon wafer substrate by spin coating and dried by heating (pre-baked) at 100° C. for 2 minutes using a hot plate to form a coating film having a thickness of 1.5 μm. Through a mask capable of forming a 10 μm line-and-space pattern, the coating film was exposed to light of mixed g-h-i-lines (436 nm, 405 nm, and 365 nm, respectively) over a dose range of 50 mJ/cm$^2$ to 200 mJ/cm$^2$, starting from 50 mJ/cm$^2$ and in increments of 50 mJ/cm$^2$ thereafter for patterning. The patterned coating film was then developed for 40 seconds or more and 90 seconds or less at 25° C. using 2.38 mass % tetramethylammonium hydroxide aqueous solution and rinsed with ultrapure water for 20 seconds to afford a laminate consisting of the coating film having lines and spaces that received different doses of exposure and of the silicon wafer.

Portions of the laminate where lines and spaces had been formed were observed with an optical microscope, and the length of the lines and spaces at the portions of the coating film exposed at different doses were measured. An approximate curve was created from the relationship between the exposure dose and the length of the lines and spaces of the resin film formed with the corresponding exposure dose. From the approximation curve, the exposure dose at the time when the lines and spaces have a length of 10 μm was calculated and recorded as sensitivity. The lower the exposure dose when the lines and spaces have a length of 10 μm, the more preferred it is because a pattern can be formed with low energy or in a short time.

<Film Retention Rate after Development>

The photosensitive resin composition was applied on a silicon wafer substrate by spin coating and dried by heating (pre-baked) at 100° C. for 2 minutes using a hot plate to form a coating film having a thickness of 1.5 μm. The coating film was then developed for 40 seconds or more and 90 seconds or less at 25° C. using 2.38 mass % tetramethylammonium hydroxide aqueous solution and rinsed with ultrapure water for 20 seconds to afford a laminate consisting of the coating film and the silicon wafer. The thickness of the resin film obtained was measured with an optical interferometric film thickness measurement system (Lambda Ace VM-1200, manufactured by SCREEN Semiconductor Solutions Co., Ltd.). % Film retention rate after development was calculated by dividing film thickness after development by film thickness before development. The higher the film retention rate after development, the more preferred it is because the varnish loss amount and unevenness during development can be reduced.

<Light Transmittance (Transparency after Heating Treatment)>

The photosensitive resin composition was applied on a glass substrate (Corning 1737, manufactured by Corning Incorporated) by spin coating and dried by heating (pre-baked) at 100° C. for 2 minutes using a hot plate to afford a coating film having a thickness of 1.5 μm. The coating film was then developed for 40 seconds or more and 90 seconds or less at 25° C. using 2.38 mass % tetramethylammonium hydroxide aqueous solution and rinsed with ultrapure water for 20 seconds. Subsequently, using an oven, post-baking in an oxidative atmosphere was performed wherein heating was performed at 230° C. for 60 minutes in an air atmosphere. In this way a laminate consisting of the resin film and the glass substrate was obtained.

For the laminate obtained, measurement was made over a wavelength range of 400 nm to 800 nm using a spectrophotometer (V-560, manufactured by JASCO Corporation). % Light transmittance at 400 nm was calculated from the measurement results and recorded as transparency after heating. % Light transmittance of the resin film was calculated as a converted value for the resin film thickness of 1.0 μm with a glass substrate without any resin film formed thereon used as a blank.

The higher the light transmittance (transparency after heating treatment), the more preferred it is because the laminate has high luminance and has beautiful appearance.

<Heat Shape Retention (%) (Heat Resistance of Pattern Dimension)>

A 10 μm line-and-space pattern was formed on a substrate using the photosensitive resin composition in the same manner as in the sensitivity measurement method described above. The entire surface of the substrate was irradiated with exposure light of g-h-i-mixed lines at a dose of 1,000 mJ/cm$^2$. Subsequently, using an oven, post-baking in an oxidative atmosphere was performed wherein heating was performed at 230° C. for 60 minutes in an air atmosphere. The line pattern of the heat-treated substrate was observed with an optical microscope. % Change in the pattern width was calculated by dividing pattern width after heat treatment by pattern width before heat treatment (10 μm). The closer the % change in the pattern width is to 100%, the more preferred it is because heat shape retention (%) is excellent.

<Chemical Resistance>

The photosensitive resin composition was applied on a silicon wafer substrate by spin coating and dried by heating (pre-baked) at 100° C. for 2 minutes using a hot plate to form a coating film having a thickness of 1.5 μm. The coating film was then developed for 40 seconds or more and 90 seconds or less at 25° C. using 2.38 mass % tetramethylammonium hydroxide aqueous solution and rinsed with ultrapure water for 20 seconds. Subsequently, using an oven, post-baking in an oxidative atmosphere was performed wherein heating was performed at 230° C. for 60 minutes in an air atmosphere. In this way a laminate consisting of the resin film and the silicon wafer substrate was obtained.

The laminated obtained was immersed in 200 mL of a resist stripper (ST106, a 7:3 mix of monoethanolamine (MEA) and dimethylsulfoxide (DMSO), kept at 25° C. in a thermostatic chamber) for 5 minutes. The thickness of the resin film was measured before and after immersion using an optical interferometric film thickness measurement system (Lambda Ace VM-1200, manufactured by SCREEN Semiconductor Solutions Co., Ltd.). % Film thickness change was calculated by dividing film thickness after immersion by film thickness before immersion. Samples with a film thickness change of within ±5% were evaluated as being good, and samples with a film thickness change of above 5% or below −5% were evaluated as being bad.

<Solubility (Miscibility of Resin and Solvent)>

The polymer and polyamideimide resin were weighed out in the types and mixing ratios as described in the columns of Examples 1 to 13 and Comparative Examples 1 to 4 in Table 1 and mixed in sample bottles. To each sample bottle was added diethylene glycol ethyl methyl ether (Hisolve EDM, manufactured by TOHO Chemical Industry Co., Ltd.) to a resin solid concentration of 20%, and the sample bottles were shaken using a shaker for a predetermined time. After a predetermined time, solubility was visually judged. Samples in which the resin was dissolved into the solvent after a predetermined time to afford a clear resin solution were evaluated as good, and samples in which the resin was not dissolved into the solvent to form a residue were evaluated as being bad.

<Compatibility (Miscibility of Resins)>

Samples were prepared in the same manner as in the solubility evaluation described above and shaken with a shaker for a predetermined time. After a predetermined time, compatibility was visually judged. Samples that afforded a clear resin solution were evaluated as being good, and samples that had white turbidity or a precipitate were evaluated as being bad.

<Taper Angle>

A 10 μm line-and-space pattern was formed on a substrate using the photosensitive resin composition in the same manner as in the sensitivity measurement method described above. The entire surface of the substrate was irradiated with exposure light of g-h-i-mixed lines at a dose of 1,000 mJ/cm$^2$. Subsequently, using an oven, post-baking in an oxidative atmosphere was performed wherein heating was performed at 230° C. for 60 minutes in an air atmosphere. A cross-sectional shape of the line pattern of the heat-treated substrate was observed with a SEM microscope. The cross-sectional shape of the line pattern is preferably a tapered shape, more preferably with a taper angle of 50° or less, and particularly preferably with a taper angle of 40° or less. With a cross-sectional shape of the line pattern having a tapered shape preferably with a smaller taper angle, electrode disconnection or other unwanted events due to the step created by the organic insulating film is less likely to occur, which advantageously leads to a high yield.

Example 2

A photosensitive resin composition was prepared and evaluated in the same manner as in Example 1 except that (i) 80 parts of the copolymer (A-1) having a p-vinylphenol monomer unit and a methyl methacrylate monomer unit obtained in Synthesis Example 1 and (ii) 20 parts of a polyamideimide resin having a branched structure (UNIDIC EMG-793, manufactured by DIC Corporation) were used instead of using (i) 85 parts of the copolymer (A-1) having a p-vinylphenol monomer unit and a methyl methacrylate monomer unit obtained in Synthesis Example 1 and (ii) 15 parts of a polyamideimide resin having a branched structure (UNIDIC EMG-793, manufactured by DIC Corporation). The results are shown in Table 1.

Example 3

A photosensitive resin composition was prepared and evaluated in the same manner as in Example 1 except that (i)

90 parts of the copolymer (A-1) having a p-vinylphenol monomer unit and a methyl methacrylate monomer unit obtained in Synthesis Example 1 and (ii) 10 parts of a polyamideimide resin having a branched structure (UNIDIC EMG-793, manufactured by DIC Corporation) were used instead of using (i) 85 parts of the copolymer (A-1) having a p-vinylphenol monomer unit and a methyl methacrylate monomer unit obtained in Synthesis Example 1 and (ii) 15 parts of a polyamideimide resin having a branched structure (UNIDIC EMG-793, manufactured by DIC Corporation). The results are shown in Table 1.

Example 4

A photosensitive resin composition was prepared and evaluated in the same manner as in Example 1 except that (iii) 12.5 parts of 4,4'-[1-[4-[1-(4-hydroxyphenyl)-1-methylethyl]phenyl]ethylidene]bisphenol esterified with 2 moles of 6-diazo-5,6-dihydro-5-oxo-naphthalene-1-sulfonic acid (TPA-520, manufactured by Miwon Commercial Co., Ltd.) and 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.) were used instead of using (iii) 12.5 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphtha ene-1-sulfonic acid (TPA-525, manufactured by Miwon Commercial Co., Ltd.), and 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.). The results are shown in Table 1.

Example 5

A photosensitive resin composition was prepared and evaluated in the same manner as in Example 1 except that (iii) 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.) and 12.5 parts of 2-(4-hydroxyphenyl)-2-(2',3',4'-trihydroxyphenyl)propane esterified with 2 moles of 6-diazo-5,6-dihydro-5-oxo-naphthalene-1-sulfonic acid (THDPP-200, manufactured by Toyo Gosei Co., Ltd.) were used instead of using (iii) 12.5 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphthalene-1-sulfonic acid (TPA-525, manufactured by Miwon Commercial Co., Ltd.), and 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.). The results are shown in Table 1.

Example 6

A photosensitive resin composition was prepared and evaluated in the same manner as in Example 1 except that (iii) 25 parts of 4,4'-[1-[4-[1-(4-hydroxyphenyl)-1-methylethyl]phenyl]ethylidene]bisphenol esterified with 2 moles of 6-diazo-5,6-dihydro-5-oxo-naphthalene-1-sulfonic acid (TPA-520, manufactured by Miwon Commercial Co., Ltd.) was used instead of using (iii) 12.5 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphthalene-1-sulfonic acid (TPA-525, manufactured by Miwon Commercial Co., Ltd.), and 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.). The results are shown in Table 1.

Example 7

A photosensitive resin composition was prepared and evaluated in the same manner as in Example 4 except that (v) 8 parts of melamine/formaldehyde/alkylmonoalcohol polycondensate (NIKALAC Mw-100LM, manufactured by Sanwa Chemical Co., Ltd.) was used instead of (v) 8 parts of 5,5'-[2,2,2-trifluoro-1-(trifluoromethyl)ethylidene]bis[2-hydroxy-1,3-benzene dimethanol] (TML-BPAF-MF, manufactured by Honshu Chemical Industry Co., Ltd.). The results are shown in Table 1.

Example 8

A photosensitive resin composition was prepared and evaluated in the same manner as in Example 4 except that (v) 8 parts of 3,3',5,5'-tetramethoxymethyl-4,4'-bisphenol (TMOM-BP, manufactured by Honshu Chemical Industry Co., Ltd.), was used instead of (v) 8 parts of 5,5'-[2,2,2-trifluoro-1-(trifluoromethyl)ethylidene]bis[2-hydroxy-1,3-benzene dimethanol] (TML-BPAF-MF, manufactured by Honshu Chemical Industry Co., Ltd.). The results are shown in Table 1.

Example 9

A photosensitive resin composition was prepared and evaluated in the same manner as in Example 1 except that (ii) 15 parts of a polyamideimide resin having a branched structure (UNIDIC EMG-1015, manufactured by DIC Corporation), and (iii) 20 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphthalene-1-sulfonic acid (TPA-525, manufactured by Miwon Commercial Co., Ltd.) and 5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.) were used instead of using (ii) 15 parts of a polyamideimide resin having a branched structure (UNIDIC EMG-793, manufactured by DIC Corporation) and (iii) 12.5 parts of 4,4'-[1-[4-[1-(4-hydroxyphenyl)-1-methylethyl]phenyl]ethylidene]bisphenol esterified with 2.5 moles of 6-diazo-5,6-dihydro-5-oxo-naphthalene-1-sulfonic acid (TPA-525, manufactured by Miwon Commercial Co., Ltd.) and 12.5 parts of 1,1,1-tris(4-hydroxyphenyl)ethane esterified with 2 moles of 6-diazo-5,6-dihydro-5-oxo-naphthalene-1-sulfonic acid (HP-200, manufactured by Toyo Gosei Co., Ltd.). The results are shown in Table 1.

Example 10

A photosensitive resin composition was prepared and evaluated in the same manner as in Example 1 except that (i) 85 parts of the copolymer (A-3) having a p-vinylphenol monomer unit and a styrene monomer unit obtained in Synthesis Example 3 was used instead of using (i) 85 parts of the copolymer (A-1) having a p-vinylphenol monomer unit and a methyl methacrylate monomer unit obtained in Synthesis Example 1. The results are shown in Table 1.

Example 11

A photosensitive resin composition was prepared and evaluated in the same manner as in Example 1 except that (i)

85 parts of the p-vinylphenol homopolymer (A-4) obtained in Synthesis Example 4 was used instead of using (i) 85 parts of the copolymer (A-1) having a p-vinylphenol monomer unit and a methyl methacrylate monomer unit obtained in Synthesis Example 1. The results are shown in Table 1.

Example 12

A photosensitive resin composition was prepared and evaluated in the same manner as in Example 1 except that (i) 70 parts of the copolymer (A-1) having a p-vinylphenol monomer unit and a methyl methacrylate monomer unit obtained in Synthesis Example 1 and (ii) 30 parts of a polyamideimide resin having a branched structure (UNIDIC EMG-793, manufactured by DIC Corporation) were used instead of using (i) 85 parts of the copolymer (A-1) having a p-vinylphenol monomer unit and a methyl methacrylate monomer unit obtained in Synthesis Example 1 and (ii) 15 parts of a polyamideimide resin having a branched structure (UNIDIC EMG-793, manufactured by DIC Corporation). The results are shown in Table 1.

Example 13

A photosensitive resin composition was prepared and evaluated in the same manner as in Example 1 except that (i) 85 parts of the copolymer (A-2) having a p-vinylphenol monomer unit and a methyl methacrylate monomer unit obtained in Synthesis Example 2 was used instead of using (i) 85 parts of the copolymer (A-1) having a p-vinylphenol monomer unit and a methyl methacrylate monomer unit obtained in Synthesis Example 1. The results are shown in Table 1.

Comparative Example 1

A photosensitive resin composition was prepared and evaluated (except for compatibility and taper angle) in the same manner as in Example 4 except that (i) 100 parts of the copolymer (A-1) having a p-vinylphenol monomer unit and a methyl methacrylate monomer unit obtained in Synthesis Example 1 was used and a polyamideimide resin having a branched structure (UNIDIC EMG-793, manufactured by DIC Corporation) as a polyamideimide was not used, instead of using (i) 85 parts of the copolymer (A-1) having a p-vinylphenol monomer unit and a methyl methacrylate monomer unit obtained in Synthesis Example 1 and (ii) 15 parts of a polyamideimide resin having a branched structure (UNIDIC EMG-793, manufactured by DIC Corporation). The results are shown in Table 1.

Comparative Example 2

A photosensitive resin composition was prepared and evaluated (except for compatibility and taper angle) in the same manner as in Comparative Example 1 except that 17 parts of 1,2-epoxy-4-(2-oxiranyl)cyclohexane adduct of 2,2-bis(hydroxymethyl)-1-butanol (EHPE 3150, manufactured by Daicel Chemical Industries, Ltd.) was further added. The results are shown in Table 1.

Comparative Example 3

A photosensitive resin composition was prepared and evaluated (except for compatibility and taper angle) in the same manner as in Comparative Example 1 except that (v) 15 parts of melamine/formaldehyde/alkylmonoalcohol polycondensate (NIKALAC Mw-100LM, manufactured by Sanwa Chemical Co., Ltd.) was used instead of using (v) 8 parts of 5,5'-[2,2,2-trifluoro-1-(trifluoromethyl)ethylidene]bis[2-hydroxy-1,3-benzene dimethanol] (TML-BPAF-MF, manufactured by Honshu Chemical Industry Co., Ltd.). The results are shown in Table 1.

Comparative Example 4

A photosensitive resin composition was prepared as in Example 1 except that (ii) 100 parts of a polyamideimide resin having a branched structure (UNIDIC EMG-793, manufactured by DIC Corporation) was used and (i) the copolymer (A-1) having a p-vinylphenol monomer unit and a methyl methacrylate monomer unit obtained in Synthesis Example 1 was not used, instead of using (i) 85 parts of the copolymer (A-1) having a p-vinylphenol monomer unit and a methyl methacrylate monomer unit obtained in Synthesis Example 1 and (ii) 15 parts of a polyamideimide resin having a branched structure (UNIDIC EMG-793, manufactured by DIC Corporation). Only some evaluations (film retention rate after development and solubility) were successful with the photosensitive resin composition. The results are shown in Table 1.

TABLE 1

| | | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| Formulation | Polymer | Copolymer (A-1) | 85 | 80 | 90 | 85 | 85 | 85 | 85 | 85 | 85 |
| | | Copolymer (A-2) | — | — | — | — | — | — | — | — | — |
| | | Copolymer (A-3) | — | — | — | — | — | — | — | — | — |
| | | Homopolymer (A-4) | — | — | — | — | — | — | — | — | — |
| | Polyamideimide resin | UNIDIC EMG793 | 15 | 20 | 10 | 15 | 15 | 15 | 15 | 15 | — |
| | | UNIDIC EMG1015 | — | — | — | — | — | — | — | — | 15 |
| | Photoactive compound | TPA 525 | 12.5 | 12.5 | 12.5 | — | — | — | — | — | 20 |
| | | TPA 520 | — | — | — | 12.5 | — | 25 | 12.5 | 12.5 | — |
| | | HP 200 | 12.5 | 12.5 | 12.5 | 12.5 | 12.5 | — | 12.5 | 12.5 | 5 |
| | | THDPP 200 | — | — | — | — | 12.5 | — | — | — | — |

TABLE 1-continued

|  |  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
|  | Cross-linker | GT401 | 33 | 33 | 33 | 33 | 33 | 33 | 33 | 33 | 33 |
|  | Additive | EHPE 3150 | — | — | — | — | — | — | — | — | — |
|  | Dissolution promoter | TMOM-BP | — | — | — | — | — | — | — | 8 | — |
|  |  | TML-BPAF-MF | 8 | 8 | 8 | 8 | 8 | 8 | — | — | 8 |
|  |  | NIKALAC Mw-100LM | — | — | — | — | — | — | 8 | — | — |
|  | Antioxidant | Irganox 1010 | 2.5 | 2.5 | 2.5 | 2.5 | 2.5 | 2.5 | 2.5 | 2.5 | 2.5 |
|  |  | Irganox 1726 | 2.5 | 2.5 | 2.5 | 2.5 | 2.5 | 2.5 | 2.5 | 2.5 | 2.5 |
|  | Surfactant | KP341 | 300 ppm | 300 ppm | 300 ppm | 300 ppm | 300 ppm | 300 ppm | 300 ppm | 300 ppm | 300 ppm |
|  | Solvent | EDM | 100 | 100 | 100 | 100 | 100 | 100 | 100 | 100 | 100 |
| Evaluation results |  | Sensitivity (mJ/cm$^2$) | 69 | 72 | 68 | 85 | 81 | 92 | 85 | 90 | 81 |
|  |  | Film retention rate after development (%) | 69 | 65 | 72 | 70 | 67 | 68 | 70 | 71 | 70 |
|  |  | Light transmittance (%) | 89 | 92 | 87 | 88 | 91 | 92 | 93 | 92 | 89 |
|  |  | Heat shape retention (%) | 115 | 111 | 116 | 114 | 115 | 118 | 119 | 120 | 119 |
|  |  | Chemical resistance | Good | Good | Good | Good | Good | Good | Good | Good | Good |
|  |  | Solubility | Good | Good | Good | Good | Good | Good | Good | Good | Good |
|  |  | Compatibility | Good | Good | Good | Good | Good | Good | Good | Good | Good |
|  |  | Taper angle (°) | 17 | 19 | 15 | 16 | 17 | 16 | 16 | 15 | 18 |

|  |  |  | Ex. 10 | Ex. 11 | Ex. 12 | Ex. 13 | Comp. Ex. 1 | Comp. Ex. 2 | Comp. Ex. 3 | Comp. Ex. 4 |
|---|---|---|---|---|---|---|---|---|---|---|
| Formulation | Polymer | Copolymer (A-1) | — | — | 70 | — | 100 | 100 | 100 | — |
|  |  | Copolymer (A-2) | — | — | — | 85 | — | — | — | — |
|  |  | Copolymer (A-3) | 85 | — | — | — | — | — | — | — |
|  |  | Homopolymer (A-4) | — | 85 | — | — | — | — | — | — |
|  | Polyamideimide resin | UNIDIC EMG793 | 15 | 15 | 30 | 15 | — | — | — | 100 |
|  |  | UNIDIC EMG1015 | — | — | — | — | — | — | — | — |
|  | Photoactive compound | TPA 525 | 12.5 | 12.5 | 12.5 | 12.5 | — | — | — | 12.5 |
|  |  | TPA 520 | — | — | — | — | 12.5 | 12.5 | 12.5 | — |
|  |  | HP 200 | 12.5 | 12.5 | 12.5 | 12.5 | 12.5 | 12.5 | 12.5 | 12.5 |
|  |  | THDPP 200 | — | — | — | — | — | — | — | — |
|  | Cross-linker | GT401 | 33 | 33 | 33 | 33 | 33 | 33 | 33 | 33 |
|  | Additive | EHPE 3150 | — | — | — | — | — | 17 | — | — |
|  | Dissolution promoter | TMOM-BP | — | — | — | — | — | — | — | — |
|  |  | TML-BPAF-MF | 8 | 8 | 8 | 8 | 8 | 8 | — | 8 |
|  |  | NIKALAC Mw-100LM | — | — | — | — | — | — | 15 | — |
|  | Antioxidant | Irganox 1010 | 2.5 | 2.5 | 2.5 | 2.5 | 2.5 | 2.5 | 2.5 | 2.5 |
|  |  | Irganox 1726 | 2.5 | 2.5 | 2.5 | 2.5 | 2.5 | 2.5 | 2.5 | 2.5 |
|  | Surfactant | KP341 | 300 ppm | 300 ppm | 300 ppm | 300 ppm | 300 ppm | 300 ppm | 300 ppm | 300 ppm |
|  | Solvent | EDM | 100 | 100 | 100 | 100 | 100 | 100 | 100 | 100 |
| Evaluation results |  | Sensitivity (mJ/cm$^2$) | 197 | 115 | 102 | 64 | 78 | 78 | 79 | — |
|  |  | Film retention rate after development (%) | 99 | 70 | 65 | 68 | 77 | 65 | 66 | 0 |
|  |  | Light transmittance (%) | 81 | 74 | 94 | 79 | 85 | 80 | 83 | — |
|  |  | Heat shape retention (%) | 113 | 112 | 107 | 115 | 0 | 0 | 20 | — |
|  |  | Chemical resistance | Good | Good | Good | Good | Good | Good | Good | — |
|  |  | Solubility | Good | Good | Good | Good | Good | Good | Good | Good |
|  |  | Compatibility | Good | Good | Good | Good | — | — | — | — |
|  |  | Taper angle (°) | 16 | 21 | 19 | 17 | — | — | — | — |

As shown in Table 1, it was demonstrated that the photosensitive resin compositions of Examples 1 to 13 which comprise both i) any of the copolymers (A-1) to (A-3) obtained in Synthesis Examples 1 to 3 and the homopolymer (A-4) obtained in Synthesis Example 4 and ii) a polyamideimide resin were able to form positive resin films with excellent heat shape retention (%).

It was also demonstrated that the photosensitive resin compositions of Examples 1 to 13 showed good solubility and compatibility, high sensitivity, excellent chemical resistance and transparency after heating, and small taper angle, leading to a less likelihood of electrode disconnection due to the step created by the organic insulating layer, and thus to a higher yield.

On the other hand, it was demonstrated that the photosensitive resin compositions of Comparative Examples 1 to 3 which did not contain a polyamideimide resin resulted in a significant reduction in heat shape retention (%).

It was also demonstrated that the photosensitive resin composition of Comparative Example 4 which contained none of the copolymers (A-1) to (A-3) and the homopolymer (A-4) showed high solubility in developer solution, resulting in a significant reduction in film retention rate after development.

INDUSTRIAL APPLICABILITY

According to the photosensitive resin compositions of the present disclosure, it is possible to form a positive resist film with excellent heat shape retention.

The photosensitive resin compositions of the present disclosure are used for example for organic electroluminescent elements, micro LEDs, micro OLEDs, touch panels.

REFERENCE SIGNS LIST

100A Organic electroluminescent device (organic EL Device)
101 Conductive substrate
102 Insulating layer
103 Organic insulating layer
103T Tapered surface
110 Organic electroluminescent element (organic EL element)
111 Anode
112 Organic EL layer
113 Cathode
150 Sealing material
151 Sealing layer
152 Sealing plate
A Taper angle
T Area

The invention claimed is:

1. A photosensitive resin composition comprising:
a polyamideimide having a branched structure,
a polymer that is different from the polyamideimide and has a monomer unit represented by the following general formula (I);

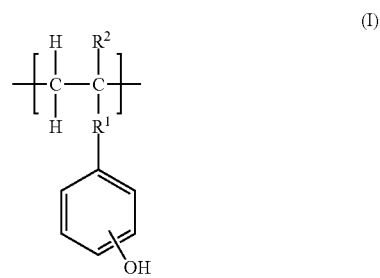

where $R^1$ is a single chemical bond or a divalent C1-C6 hydrocarbon group which may have a substituent, and $R^2$ is a hydrogen or a monovalent C1-C6 hydrocarbon group which may have a substituent,
a photoactive compound, and
a cross-linker, wherein
a content ratio by mass of the polymer to the polyamideimide (polymer:polyamideimide) is 90:10 to 70:30.

2. The photosensitive resin composition according to claim 1, wherein the polyamideimide has a number-average molecular weight of 1,000 or more and 30,000 or less.

3. The photosensitive resin composition according to claim 1, wherein the polymer is a copolymer further having a (meth)acrylate monomer unit.

4. A photosensitive resin composition comprising:
a polyamideimide having a branched structure, and
a polymer that is different from the polyamideimide and has a monomer unit represented by the following general formula (I);

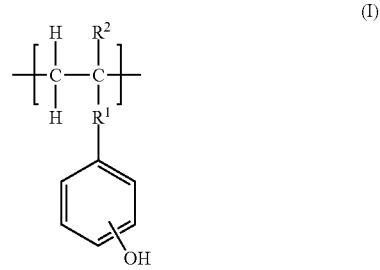

where $R^1$ is a single chemical bond or a divalent C1-C6 hydrocarbon group which may have a substituent, and $R^2$ is a hydrogen or a monovalent C1-C6 hydrocarbon group which may have a substituent, wherein
the polymer is a copolymer further having a (meth)acrylate monomer unit.

5. The photosensitive resin composition according to claim 4, wherein the polyamideimide has a number-average molecular weight of 1,000 or more and 30,000 or less.

6. The photosensitive resin composition according to claim 4, wherein a content ratio by mass of the polymer to the polyamideimide (polymer:polyamideimide) is 90:10 to 70:30.

7. The photosensitive resin composition according to claim 4, further comprising a photoactive compound and a cross-linker.

* * * * *